United States Patent [19]

Nakao

[11] Patent Number: 5,291,048
[45] Date of Patent: Mar. 1, 1994

[54] NON-VOLATILE STORAGE DEVICE WITH IMPURITIES IN NITRIDE TOWARD SOURCE SIDE

[75] Inventor: Hironobu Nakao, Kyoto, Japan
[73] Assignee: Rohm Co., Ltd., Kyoto, Japan
[21] Appl. No.: 885,684
[22] Filed: May 19, 1992
[30] Foreign Application Priority Data Sep. 9, 1991 [JP] Japan .................. 3-227575

[51] Int. Cl.$^5$ .................. H01L 29/78; H01L 29/34
[52] U.S. Cl. .................. 257/325; 257/639; 365/184
[58] Field of Search ............ 257/325, 324, 326, 639; 365/184

[56] References Cited

U.S. PATENT DOCUMENTS 4,173,791 11/1979 Bell ........................ 257/324
4,481,527 11/1984 Chen et al. ................ 257/325
4,870,470 9/1989 Bass, Jr. et al. ............ 257/324

OTHER PUBLICATIONS

Li et al. "Stable Gate MOSFET Structures" IBM Technical Disclosure Bulletin vol. 15, No. 9 Feb. 1973 pp. 2937-2938.

Primary Examiner—Rolf Hille
Assistant Examiner—Robert Limanek
Attorney, Agent, or Firm—Oliff & Berridge

[57] ABSTRACT

A non-volatile storage device such as an EPROM (erasable programmable read only memory) and a method of manufacturing the same. A silicon oxide film, a silicon nitride film and a silicon oxide film are formed one after another on a gate region of a semiconductor substrate in which a source region and a drain region are formed. To restrict carrier capture to the silicon nitride film near the source region, impurity ions such as hydrogen ions are mixed with the silicon nitride film at a side toward the source region.

6 Claims, 4 Drawing Sheets

NON-VOLATILE STORAGE DEVICE WITH IMPURITIES IN NITRIDE TOWARD SOURCE SIDE

BACKGROUND OF THE INVENTION

1. Field of the Invention:

This invention relates to a non-volatile storage device, and more particularly to an EPROM (Erasable Programmable Read Only Memory) which has an improved selectivity.

2. Description of the Related Art:

Non-volatile memories are devices which are important in widening the application of general purpose LSIs; for example, they are used as EPROMs.

FIGS. 4A and 4B of the accompanying drawings show a MONOS (Metal Oxide Nitride Oxide Semiconductor) memory as a typical non-volatile storage device. The MONOS memory comprises a silicon oxide film 12, a silicon nitride film 14, a silicon oxide film 16 and a polysilicon electrode 18, which are laminated in order in a gate region of a p-type silicon substrate 10. During data writing, as shown in FIG. 4A, assume that a positive bias, e.g. $Vg=10$ V, is applied to the gate electrode; $Vd=9$ V, to a drain electrode; and $Vs=0$ V, to a source electrode. Then electrons from the silicon substrate 10 are captured and accumulated in the silicon nitride film 14 through the silicon oxide film 12 (tunnel phenomenon). With the charges accumulated, a drain current does not flow unless a voltage sufficiently excessive to cancel the captured charges is applied. Therefore the condition where upon this drain current flows or does not flow corresponds to 1 bit of data.

During erasing, as erasing, as shown in FIG. 4B, assume that a negative bias, e.g. $Vg=-6$ V, is applied to the gate electrode; $Vd=9$ V, to the drain electrode; and $Vs=0$ V, to the source electrode. Then holes cancel the electrons captured and accumulated in the silicon nitride film 14 through the silicon oxide film 12, so that a drain current will flow.

Thus, in the conventional MONOS memory, data is stored and erased by injecting electrons and holes into the silicon nitride film 16. In the event that a bias is applied to the gate electrode, the electric field becomes gradually weaker toward the drain electrode obliquely from the source electrode as indicated by arrows in FIG. 3. Therefore, during storing and erasing data, electrons and holes are injected only in a predetermined area of the drain region rather than the entire area of the silicon nitride film 14 so that the remaining area of the silicon nitride film is kept in a fresh condition. Injection of electrons and holes into this predetermined area makes it possible to keep the selector transistor function of the storage device.

Namely, in the case where holes are captured in the entire area of the silicon nitride film during erasing, if the holes are excessively injected (this might be caused due to the staggering characteristics at the time of production), a drain current would normally flow even in the absence of a bias to the gate electrode. As a result, because of the fact that it is composed of a plurality of MONOS elements, an EPROM does not function as a selector transistor.

Thus to function as an EPROM, the storage device requires that electrons or holes should not be captured near the source region of the silicon nitride film. However, in the conventional storage device, since electrons and holes are injected with a large quantity of energy from near the drain, there is a slight probability that the electrons and holes would move toward the source and be captured.

If the channel of the gate is lengthened, areas devoid of captured electrons or holes would be formed, but reduction in the size of the device cannot be achieved.

SUMMARY OF THE INVENTION

It is therefore an object of this invention to provide a non-volatile storage device which can function reliably as a selector transistor, with no carrier, such as electron or hole, captured by a silicon nitride film near a source region.

Another object of the invention is to provide a method of manufacturing the above-mentioned non-volatile storage device.

According to a first aspect of the invention, there is provided a non-volatile storage device comprising: a semiconductor substrate on which a source region and a drain region are formed; a first oxide film formed on a gate region between the source region and the drain region of the semiconductor substrate; a nitride film formed on the oxide film and containing a predetermined concentration of impurity mixed with the nitride film at a side toward the resource region; and a second oxide film formed on the nitride film.

According to a second aspect of the invention, there is provided a method of manufacturing a non-volatile storage device, comprising the steps of: forming a first oxide film on a semiconductor substrate; forming a nitride film on the first oxide film; forming a second oxide film on the nitride film; forming a resist on the second oxide film and forming openings in a pattern of predetermined regions of the resist; injecting impurity ions into the nitride film from the openings; diffusing the injected impurity ions by heating at a predetermined temperature; and forming a source region on the nitride film of the semiconductor substrate at one side in which the impurity ions are injected and forming a drain region on the nitride film of the semiconductor substrate at the other side.

In the non-volatile storage device of the invention, impurities are mixed into the nitride film at the side toward the source region so that the impurities are bonded with the dangling bond of the nitride film which is then prevented from being bonded with the dangling bond of the carriers injected from the semiconductor substrate, thus restricting the carriers from being captured in the nitride film at the side toward the source region.

Therefore, even if carriers are excessively injected from the semiconductor substrate, it is possible to keep the nitride film at the side toward the source region normally in a fresh state so that the function of a selector transistor can be maintained.

DETAILED DESCRIPTION

A non-volatile storage device and a non-volatile storage device manufacturing method according to one embodiment of this invention will now be described with reference to the accompanying drawings.

Figure 1:
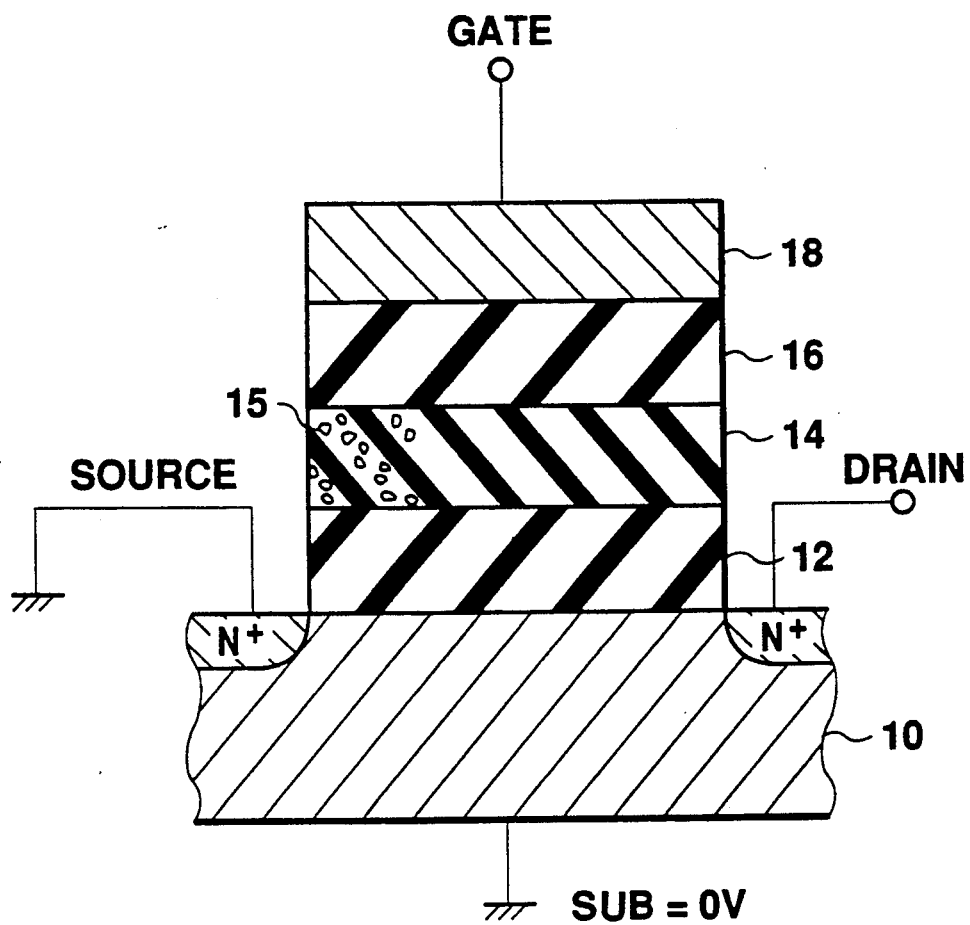
FIG. 1 is a cross-sectional view of a non-volatile storage device according to one embodiment of this invention.

FIG. 1 shows the non-volatile storage device of this invention. The non-volatile storage device, like the conventional MONOS memory, comprises a silicon oxide film 12, a silicon nitride film 14, a silicon oxide film 16 and a polysilicon electrode 18, which are laminated in order on a silicon substrate 10 on which a source electrode and a drain electrode are formed.

A feature of this embodiment is that impurities 15 such as hydrogen ions or oxygen ions are mixed in the silicon nitride film 14 at the side toward the source region. The impurities 15 are bonded with the dangling bond defined by silicon in the silicon nitride film 14, presumably restricting electrons and holes from being bonded with this dangling bond.

Therefore during storing data in the non-volatile storage of this embodiment, if $Vg=10$ V, $Vs=0$ V and $Vd=9$ V are applied to the gate electrode 18, the source electrode and the drain electrode, respectively, electrons are injected from the silicon substrate 10 and are captured by the silicon nitride film 14. Even if the captured electrons are moved to the source region side, they will not be captured there, thus keeping the source region side of the silicon nitride film 14 in a fresh state.

During erasing data, even if $Vg=-6$ V, $Vs=0$ V and $Vd=9$ V are applied to the gate electrode 18, the source electrode and the drain electrode, respectively, the injected holes are not captured at the source region side, thus likewise keeping the source region side of the silicon nitride 14 in a fresh state.

Further although there is a slight probability that carriers will be injected into the silicon nitride film 14 from the silicon substrate 10 at the side connected to the source, they will not be captured because of the impurities in the silicon nitride film 14.

Thus with this non-volatile storage device, since carriers are not captured at the source region of the silicon nitride film, the source region side of the silicon nitride 14 will function as an insulating film even if excessive holes are injected into the drain region side during erasing, for example. Therefore this storage device can function as a selector transistor.

Figure 2:
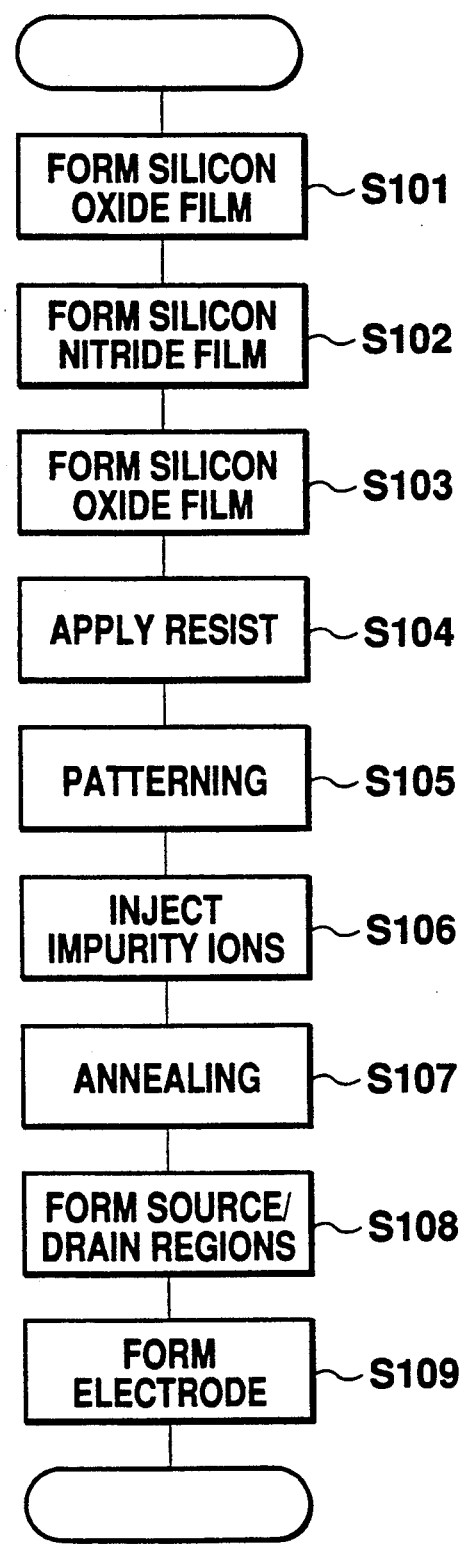
FIG. 2 is a flow diagram showing a method of manufacturing the non-volatile storage device of FIG. 1.
Figure 3A:
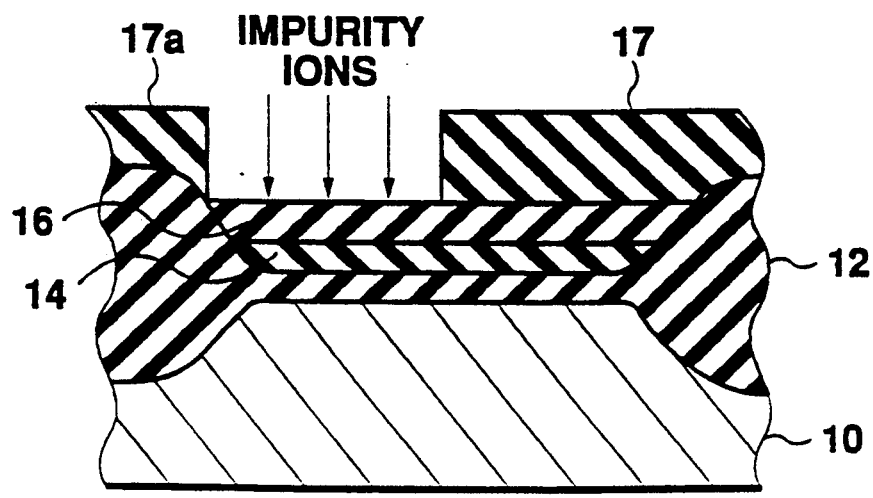
FIG. 3A is a cross-sectional view showing how impurity ions are injected in the method of FIG. 2.
Figure 3B:
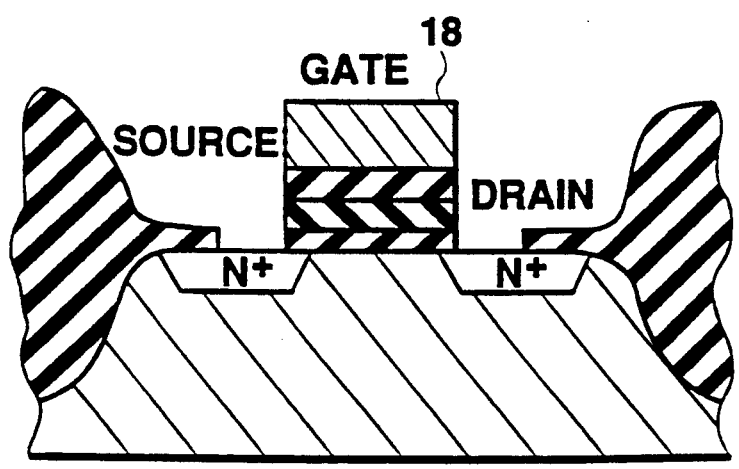
FIG. 3B is a cross-sectional view showing how a source region and a drain region are formed in the method of FIG. 2.
Figure 4A:
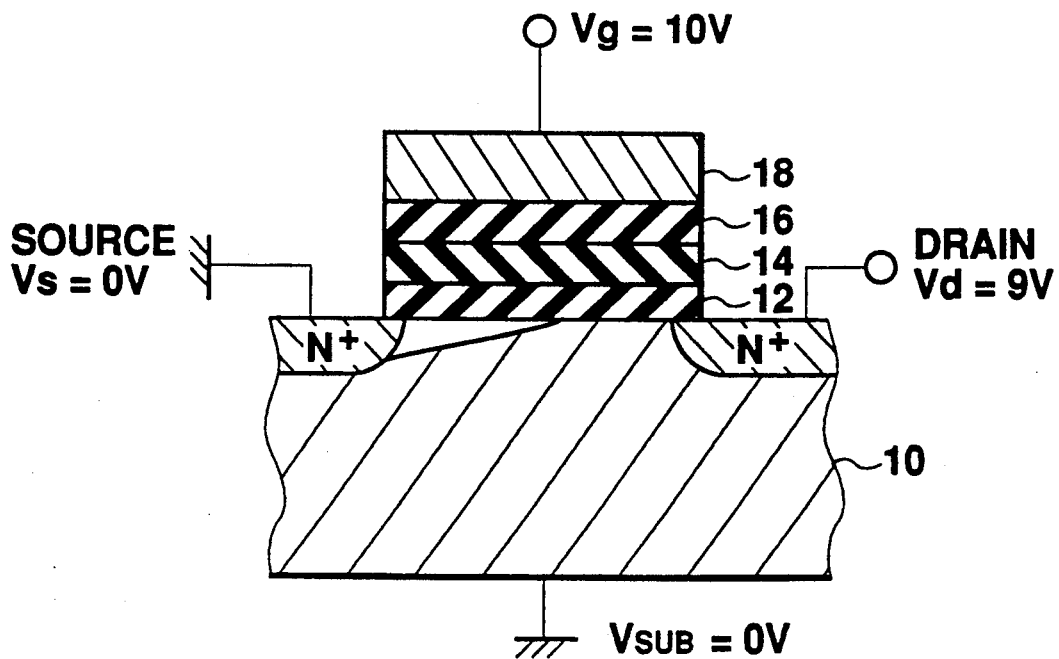
FIG. 4A is a cross-sectional view showing how data is stored according to a conventional storage device.
Figure 4B:
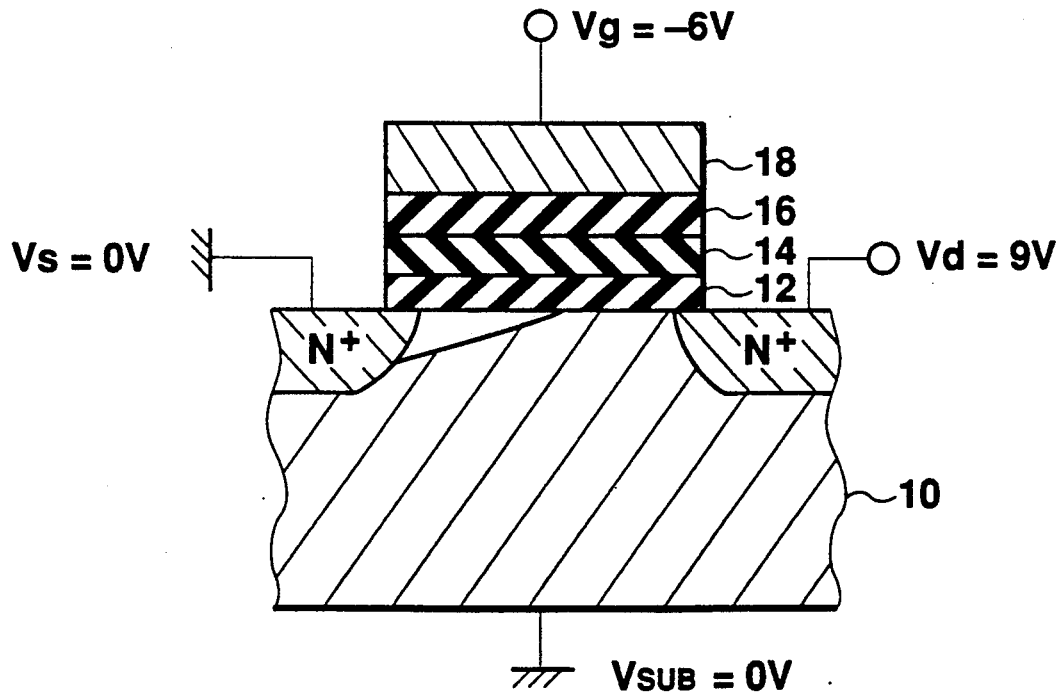
FIG. 4B is a cross-sectional view showing how data is erased according to the conventional storage device.

FIG. 2 is a flow diagram showing the non-volatile storage device manufacturing method; and FIGS. 3A and 3B are cross-sectional views showing an impurity ion injecting step and a source/drain region forming step, respectively, in this manufacturing method. Like the conventional MONOS memory manufacturing method, the silicon oxide film 12 is formed on the silicon substrate 10 by the LOCOS (Local Oxidation of Silicon) method (S101). Then the silicon nitride film 14 and the silicon oxide film 16 are formed in order on the silicon oxide film 12 by the sputtering method and the CVD method, for example (S102 and S103).

Then a photoresist is applied over the silicon oxide film 16 such as by spin coating (S104), and an opening 17a is formed in the area where the source region is to be formed by photoetching technology (S105). Having the patterned photoresist as a mask, as shown in FIG. 3(A), impurity ions such as hydrogen ions or oxygen ions are injected into the silicon nitride film 14 (S106). After injecting the impurity ions, a semiconductor substrate is annealed at 900#C (S107) to diffuse the injected impurity ions, thus facilitating that the impurity ions should be bonded with the dangling bond of silicon in the silicon nitride film 14 (S107).

After mixing the impurity ions in a predetermined region of the silicon nitride film 14, a polysilicon electrode 18 is laminated over the silicon oxide film 16, and finally, as shown in FIG. 3(B), a source region and a drain region are formed by a self-filament process (S108), and an electrode is formed at a contact portion of each of the source and drain regions (S109). This self-filament process is a manufacturing method which enables downsizing of a transistor. In this embodiment, a self-filament process is used such that either the distance between the contact portion of the source region and a gate electrode or the distance between the contact portion of the drain region and the gate electrode is substantially zero. Namely, after forming the polysilicon electrode 18 on the silicon oxide film 16, the surface of the polysilicon electrode 18 is oxidized whereupon a nitride film is heaped. Then, leaving the nitride film at only the gate electrode portion, the polysilicon is etched, and selective oxidation is performed. Having the nitride film as a mask, the oxide film is removed by RIE (Reactive Ion Etching). Subsequently after the nitride film is removed, ions are injected into the source and drain regions to form a source region and a drain region. Leaving the nitride film at the contact portion of each of the source and drain regions, selective oxidation is performed whereupon all of the nitride film is removed. As a result, the distance between the gate electrode and the contact portion of each of the source and drain regions becomes substantially zero, thus reducing the size of the storage device.

In the illustrated embodiment, impurity ions are mixed in the silicon nitride film by ion implantation. Alternatively, impurities may be mixed such as by annealing the silicon nitride film in an impurity atmosphere, by a thermal diffusion process after coating impurities over the silicon nitride film and by a plasma process, or a combination.

With the non-volatile storage device and the non-volatile storage device manufacturing method according to this invention, since impurities are mixed in the silicon nitride film at the source region side to restrict the carriers from being captured at the source region side, it is possible to keep the function of a selector transistor so that repeated storing can be performed. Since mixing the impurities can restrict the carriers from being captured due to the carrier movement, it is possible to reduce the length of the gate, thus reducing the storage device in size.

What is claimed is:

1. A non-volatile storage device comprising:
    a semiconductor substrate having a source region and a drain region;
    a first oxide film formed on a gate region between said source region and said drain region of said semiconductor substrate;
    a nitride film formed on said oxide film and containing a predetermined higher concentration of impurity mixed with said nitride film at a side toward said source region than at a side toward said drain region; and a second oxide film formed on said nitride film.

2. A non-volatile storage device according to claim 1, wherein said oxide films are silicon oxide films and said nitride film is a silicon nitride film.

3. A non-volatile storage device according to claim 1, wherein an electrode is formed on each of said source region, said drain region and said second oxide film.

4. The non-volatile storage device according to claim 1, wherein said impurity is hydrogen ions.

5. The non-volatile storage device according to claim 1, wherein said impurity is oxygen ions.

6. A non-volatile storage device according to claim 1, wherein the voltages applied to said gate region, said source region, and said drain region, are between eight and twelve volts.

* * * * *